(12) United States Patent
Karnik et al.

(10) Patent No.: US 10,607,885 B2
(45) Date of Patent: Mar. 31, 2020

(54) SHELL STRUCTURE FOR INSULATION OF A THROUGH-SUBSTRATE INTERCONNECT

(71) Applicant: Intel Corporation, Santa Clara, CA (US)

(72) Inventors: Tanay Karnik, Portland, OR (US); William Wahby, Atlanta, GA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/085,925

(22) Filed: Mar. 30, 2016

(65) Prior Publication Data

US 2017/0287781 A1 Oct. 5, 2017

(51) Int. Cl.
*H01L 21/00* (2006.01)
*H01L 21/768* (2006.01)
*H01L 23/528* (2006.01)

(52) U.S. Cl.
CPC ...... *H01L 21/76898* (2013.01); *H01L 23/528* (2013.01)

(58) Field of Classification Search
CPC . H01L 21/76898; H01L 23/481; H01L 24/94; H01L 25/0657; H01L 2225/06544; H01L 2924/1461; H01L 2924/12042; H01L 2924/00; H01L 23/147; H01L 23/5384; H01L 23/528
USPC ........................................................ 257/774
See application file for complete search history.

(56) References Cited

U.S. PATENT DOCUMENTS

| | | | |
|---|---|---|---|
| 8,940,631 B1* | 1/2015 | Sridhar | H01L 21/486 438/618 |
| 2006/0043572 A1 | 3/2006 | Sugimoto et al. | |
| 2006/0264029 A1* | 11/2006 | Heck | H01L 21/76898 438/622 |
| 2007/0222021 A1 | 9/2007 | Yao | |
| 2009/0093100 A1 | 4/2009 | Xia et al. | |
| 2010/0207103 A1 | 8/2010 | Farrow et al. | |
| 2010/0270593 A1 | 10/2010 | Lung et al. | |
| 2012/0261826 A1* | 10/2012 | Kuo | H01L 21/76898 257/774 |
| 2013/0050227 A1* | 2/2013 | Petersen | H01L 23/053 345/501 |

(Continued)

OTHER PUBLICATIONS

Xiao, Kai, et al., "Compact via Structures and Method of Making Same", U.S. Appl. No. 14/752,642, filed Jun. 26, 2015, 48 pgs.

(Continued)

*Primary Examiner* — Calvin Y Choi
(74) *Attorney, Agent, or Firm* — Womble Bond Dickinson (US) LLP (57) ABSTRACT

Techniques and mechanisms for providing electrical insulation of a through-substrate interconnect (TI). In an embodiment, the TI extends between a first side of the substrate and a second side of the substrate opposite the first side. The substrate has formed therein a conductive shell structure that extends at least partially around a periphery of the TI. A first dielectric liner structure is disposed between the conductive shell structure and a bulk material of the substrate. A second dielectric liner structure is disposed between the conductive shell structure and the TI. In another embodiment, a voltage of the conductive shell structure is allowed to float while the TI exchanges a signal or a supply voltage.

18 Claims, 8 Drawing Sheets

(56) References Cited

U.S. PATENT DOCUMENTS

2013/0299992 A1* 11/2013 Chang ................ H01L 21/6835
257/751

OTHER PUBLICATIONS

PCT Application No. PCT/US2017/016195, International Search Report and the Written Opinion, dated May 31, 2017, 14 pgs.

* cited by examiner

View E-E'

View F-F'

View G-G'

SHELL STRUCTURE FOR INSULATION OF A THROUGH-SUBSTRATE INTERCONNECT

BACKGROUND

1. Technical Field

Embodiments of the invention relate generally to the field of microelectronic devices and more particularly, but not exclusively, to isolation structures for protecting signaling in a substrate.

2. Background Art

System designers are increasingly relying on vertical stacking of integrated circuitry to improve the bandwidth and power requirements for signaling between components. In a typical stacked system, vertical interconnect structures, called through-silicon vias (TSVs), pass through bulk silicon to interconnect integrated circuit chips that are arranged in a stack. By reducing the distance that signals must travel, TSVs often provide for improved bandwidth of communication links. While TSVs typically have low resistance compared to the on-chip wires to which they are connected, the capacitance of a single TSV is often far greater than the capacitance of such on-chip wires. The combination of relatively more resistive on-chip wires and relatively more capacitive TSV can act as a significant RC-based source of signal delay. This delay can limit the maximum bandwidth capacity of a TSV link, and/or may necessitate the use of large transistors for driving signals.

Consequently, TSV capacitance tends to contribute to slower clocking, signal crosstalk coupling and/or other signal integrity complications. As a result, this type of capacitance limits signaling bandwidth capacity of links including TSVs, and/or increases energy requirements for signaling with such links. As successive generations of integrated circuit technologies continue to trend toward smaller scales and faster data rates, the sensitivity of such technology to slew rate characteristics is expected to increase. Accordingly, conventional techniques for mitigating the effects of poor slew rate are expected to be inadequate for the future demands of manufacturers.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously include techniques and/or mechanisms for providing effective signaling through a substrate such as that of an integrated circuit (IC) chip or a printed circuit board (PCB). In some embodiments, a first structure (referred to herein as a "through-substrate interconnect") extends from one side of a substrate through to a second side of the substrate, where the substrate has formed therein a conductive shell structure that extends at least partially around a periphery of the first structure. Insulation material disposed in the substrate may, in combination with the shell structure, provide for electrical isolation between the through-substrate interconnect and a bulk material of the substrate.

As used herein, "through-substrate interconnect" (or, for brevity, "TI") refers to a conductive structure, formed within a hole, which enables electrical coupling through the substrate in which the hole is formed. In many technologies, a substrate—having traces, vias and/or other interconnect structures formed therein or thereon—can contribute significantly to a capacitance. Certain embodiments result from a realization that the effect of such capacitance may be mitigated at a TI—e.g., by forming in the substrate a conductor (referred to herein as a "conductive shell structure" or, for brevity, "shell structure") that is insulated from the TI, and that extends at least partially around a periphery of the TI. Opposite sides of a conductive shell structure may adjoin respective dielectric regions that provide at least partial isolation from a TI and from a substrate material that extends around the TI and the conductive shell structure.

In some embodiments, such a shell structure is electrically decoupled from any external conductor, allowing a voltage of the shell structure to float during operation of an IC device that includes the shell structure. Alternatively, a shell structure may be coupled to circuitry that is to provide a fixed voltage—e.g., other than a ground or other such reference potential—during signaling with a TI. In one illustrative embodiment, the shell structure may be maintained at a voltage equal to half of a supply voltage (0.5 Vcc) for operating the IC device. Mitigation of capacitance with a shell structure according to an embodiment may provide for improved signal characteristics (e.g., including reduced signal delay) and/or enable reduced power consumption for the exchange of signals.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate having formed therein one or more through-substrate interconnects. Certain features of various embodiments are described herein with reference to the formation of a shell structure that extends entirely around the periphery of a TI having a circular cross-section. However, such description may be extended to additionally or alternatively apply to a shell structure that extends only partially around a TI and/or to insulation of a TI that has a square, elliptical or other non-circular cross-section.

Figure 1:
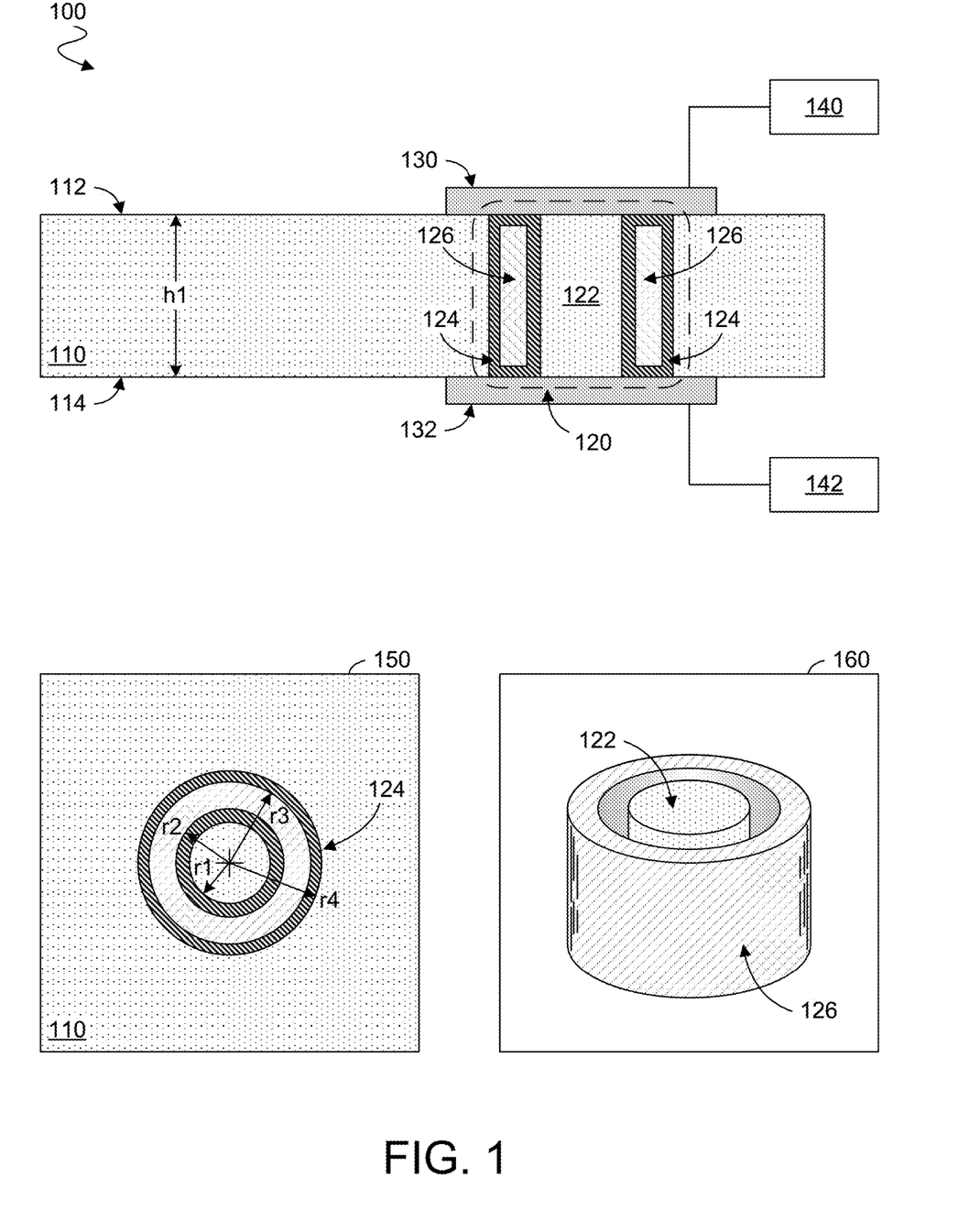
FIG. 1 shows various views of a device to provide insulation of a through-substrate interconnect according to an embodiment.

FIG. 1 shows features of a device 100 including structures to provide at least partial electrical insulation of a through-substrate interconnect according to an embodiment. Device 100 is one example of an embodiment comprising a conductive shell structure that is insulated from, and extends at least partially around, a TI. Such a shell structure may be further insulated from a substrate material that, in a plane between opposing sides of a substrate, extends around the shell structure and the TI.

In the illustrative embodiment shown, device 100 includes a substrate 110, a region 120 of which has formed therein a through-substrate interconnect 122 extending from a first side 112 of substrate 110 to a second side 114 of substrate 110 that is opposite side 112. Substrate 110 may be only part of a stacked structure of device 100. For example, device 100 may further comprise a metal stack that is disposed on one of sides 112, 114. In such an embodiment, TI 122 may only extend to (but not through) the metal stack. Some or all structures in region 120 may variously extend to one or both of sides 112, 114—e.g., wherein, in a plane extending between and parallel to sides 112, 114, a bulk material of substrate 110 surrounds such structures of region 120.

Substrate 110 may be a substrate of an IC chip—e.g., wherein substrate 110 includes a semiconductor material such as silicon. In some embodiments, substrate 110 includes any of a variety of materials that, for example, are used in cores of conventional IC devices. For example, substrate 110 may include an epoxy, resin and/or a glass. In one embodiment, substrate 100 forms a monolithic core structure. Alternatively, substrate 100 may include multiple layers (not shown) of a laminate core. In some embodiments, substrate forms the main body of a printed circuit board.

In an embodiment, device 100 includes, or is coupled to, one or more circuits that are to participate in an exchange of a signal, a supply voltage and/or the like. The exchange may be a unidirectional or bidirectional exchange using TI 122. By way of illustration and not limitation, TI 122 may be coupled to a circuit 140 via a conductive path through side 112—e.g., wherein an interconnect structure 130 (such as a pad, bump or other conductive contact) provides connectivity at side 112 between TI 122 and signal trace extending to circuit 140. Alternatively or in addition, TI 122 may be coupled to another circuit 142 via a conductive path through side 114—e.g., where another interconnect structure 132 provides connectivity at side 114 between TI 122 and a signal trace extending to circuit 142. TI 122 may be fabricated by processing which is subsequent to the formation of circuit 140 (or alternatively, circuit 142) on substrate 110. Formation of interconnect structures 130, 132 may include operations adapted from conventional metallization techniques to form metal (e.g., copper) pads, bumps, traces or other such structures. In some embodiments, interconnect structure 130 is at least partially disposed within substrate 110 at side 112 and/or interconnect structure 132 is at least partially disposed within substrate 110 at side 114.

In one embodiment, a build-up layer (not shown) of device 100 is coupled to substrate 110 at one of sides 112, 114, where circuit 140 or circuit 142 is included in such a build-up layer or, alternatively, is coupled to substrate 110 via the build-up layer. For example, circuits 140, 142 may be integrated on different respective IC chips (e.g., where one such IC chip includes substrate 110). In such an embodiment, one of circuits 140, 142 may be on an IC chip other than the one which includes substrate 110. This other IC chip may couple to TI 122 via a metal to metal bond—e.g., where the other of circuits 140, 142 is on the same IC chip as TI 122, and is coupled to TI 122 via a metal stack of that same IC chip. One of circuits 140, 142 may include a voltage regulator or other such circuitry that is to provide a supply voltage to the other of circuits 140, 142. In another embodiment, circuits 140, 142 are to exchange any of a variety of data, address and/or control signals via TI 122. However, some embodiments are not limited with respect to a particular functionality of one or both of circuits 140, 142 and/or with respect to a particular exchange that is might be performed with TI 122.

To improve the operational reliability of device 100, some embodiments at least partially insulate TI 122 from the capacitive effects of one or more other structures between sides 112, 114. For example, such insulation of TI 122 may be facilitated by a conductive shell structure, such as one formed by the illustrative conductor 126 shown. Conductor 126 may include copper, aluminum, tungsten, zinc and/or any of a variety of one or more metals. An insulator structure 124 may extend between conductor 126 and TI 122 and/or between conductor 126 and the surrounding material of substrate 110. Insulator structure 124 may include a dielectric material to provide at least partial isolation of conductor 126 from TI 122 and/or a material of substrate 110 that is outside of region 120. For example, insulator structure 124 may form one or both of a first dielectric liner portion extending around an outer sidewall of conductor 126 and a second dielectric liner portion extending along an interior sidewall of conductor 126.

A cross-sectional view 150 in FIG. 1 illustrates features of device 100 in a plane extending between, and parallel to, sides 112, 114. As shown by view 150, TI 122 may have a circular cross-sectional profile with a radius r1. Conductor 126 may have inner and outer radii r2, r3—e.g., wherein TI 122 and conductor 126 are coaxial within substrate 110. Insulator structure 124 may have an innermost sidewall that adjoins the perimeter of TI 122 at radius r1. Additionally or alternatively, insulator structure 124 may have an outermost radius r4 that is larger than r3. In a perspective view 160 of device 100, substrate 110 and other structure are omitted to show in detail respective structures of TI 122 and conductor 126.

In an embodiment, TI 122 and/or conductor 126 include any of a variety of conductive materials adapted from conventional semiconductor fabrication techniques. By way of illustration and not limitation, one or both of TI 122 and conductor 126 may include copper, tungsten, polysilicon and/or the like. Insulating liner structures formed in region 120 may comprise any of various dielectric materials adapted from conventional semiconductor processing. For example, one or more liner portions formed by insulator structure 124 may include silicon dioxide ($SiO_2$), silicon nitride (SiN) and/or any of various silicide compounds.

In some embodiments, a width of some or all insulation structures in region 120 (e.g., the width measured radially from a sidewall of TI 122) is less than a diameter or other overall width of TI 122. By way of illustration and not limitation, r1 may be within a range of 1 micron (μm) to 10 μm. In such an embodiment, a thickness of conductor 126 (e.g., a difference between r3 and r2) may be within a range of 250 nanometers (nm) to 750 nm. Alternatively or in addition, a thickness of an inner dielectric liner structure (e.g., a difference between r2 and r1)—and/or a thickness of an outer dielectric liner structure (e.g., a difference between r4 and r3)—may be within a range of 50 nm to 300 nm. In some embodiments, a thickness of a conductive shell structure such as is less than ten percent (10%) of a TI thickness—e.g., where a thickness of conductor 126 is less than 5% (and in some embodiments, less than 3%) the thickness of TI 122. An aspect ratio of TI 122—e.g., a ratio of r1 to h1—may be as small as 0.1, for example. In one illustrative embodiment, h1 is within a range of 10 μm to 100 μm. However, the above-described dimensions of device 100 are merely illustrative, and some or all such dimensions may vary significantly according to implementation-specific details.

A coaxial arrangement of a TSV and a surrounding shell structure, according to one embodiment, can be modeled as a simple coaxial capacitor with a capacitance $C_{core}$ represented, for example, by the following equation (1):

$$C_{core} = \frac{2\pi\varepsilon L}{\ln\left(\frac{r_a}{r_{core}}\right)},$$

where ε is a permittivity of a dielectric (such as insulation structure 124), L is a length of the TSV (e.g., h1), $r_{core}$ is a radius (e.g., r1) of a TI, and $r_a$ is the inner radius (e.g., r2) of the conductive shell structure. A capacitance $C_{shell}$ between the conductive shell structure and the substrate represented by the following equation (2):

$$C_{shell} = \frac{2\pi\varepsilon L}{\ln\left(\frac{r_c}{r_b}\right)},$$

where $r_b$ is the outer radius (e.g., r3) of of the conductive shell structure, and $r_c$ is an outer radius (e.g., r4) of a dielectric liner extending around the periphery of the conductive shell structure. In an embodiment where a voltage of the shell is allowed to float, the overall capacitance $C_{tot}$ between the TI and the surrounding substrate may be modeled as the series combination of $C_{core}$ and $C_{shell}$ shown in the following equation (3):

$$C_{tot} = \left(\frac{1}{C_{core}} + \frac{1}{C_{shell}}\right)^{-1}.$$

If the insulating liner separating the TI and the conductive shell is thin—e.g., as compared to the diameter of the TI core—then $C_{core}$ may be approximately equal to $C_{shell}$, and $C_{tot}$ may be approximately equal to $C_{core}/2$.

Fabrication of the structures in region 120 may include the formation of a hole between sides 112, 114—e.g., using operations adapted from conventional semiconductor, package, or board processing, e.g. wet chemical etching, plasma etching, ion milling, laser etching, mechanical milling and/or other such techniques. Such fabrication may further comprise depositing in the hole one or more conductive materials and one or more dielectric materials. For example, copper and/or any of various other metals (e.g., including an alloy) may be plated or otherwise deposited by operations adapted from conventional metallization techniques. Some examples of such techniques include, but are not limited to, paste printing, electroless deposition and vapor deposition. Alternatively or in addition, one or more dielectric structures may be deposited by operations adapted from any of various conventional deposition techniques.

Figure 2:
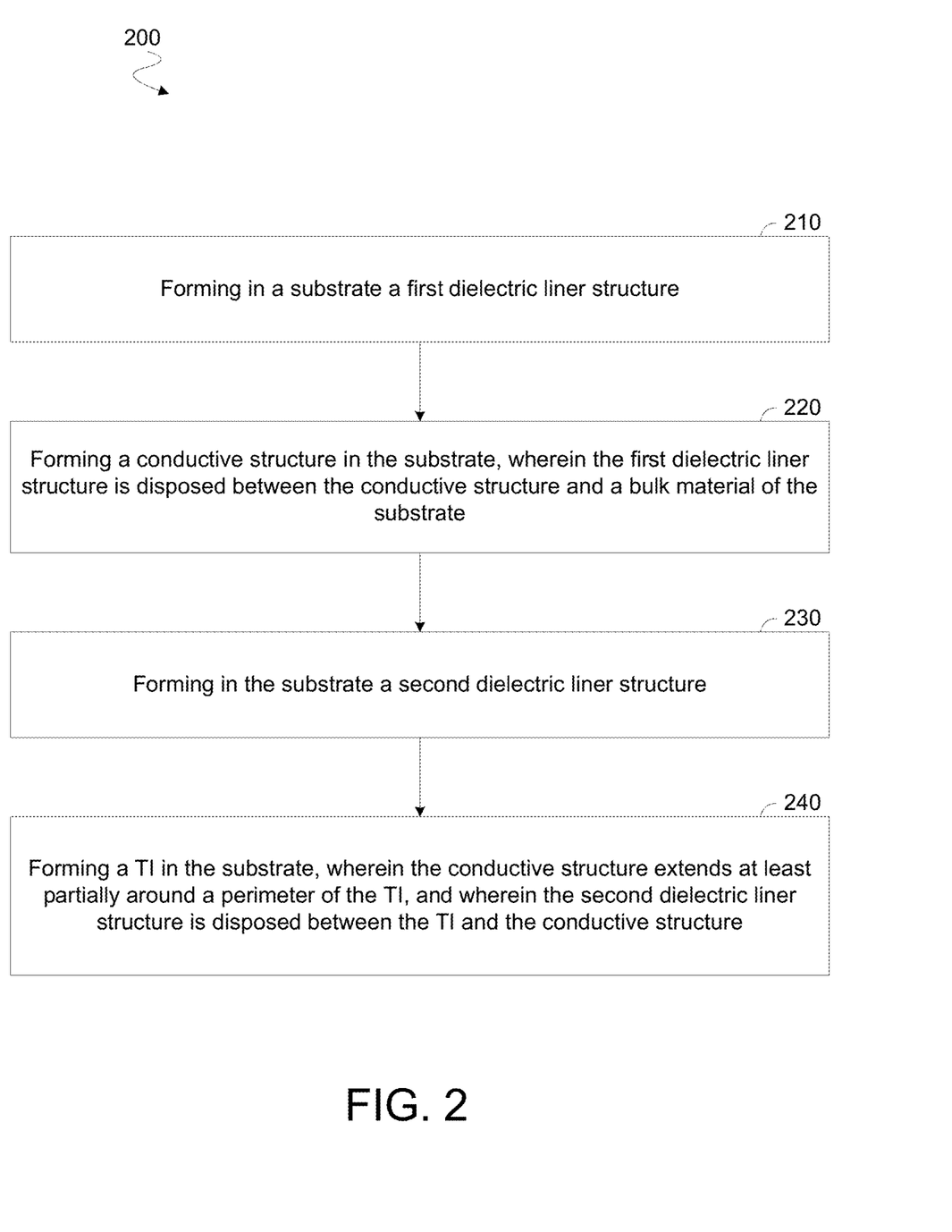
FIG. 2 is a flow diagram illustrating elements of a method to form insulation structures in a substrate according to an embodiment.

FIG. 2 shows features of a method 200 to fabricate an at least partially insulated through-substrate interconnect according to an embodiment. Method 200 may include operations to fabricate device 100, for example. To illustrate certain features of various embodiments, method 200 is described herein with reference to the fabrication of structures variously shown in FIGS. 3A, 3B. However, such description may be extended to apply to any of a variety of additional or alternative structures, according to different embodiments.

Figure 3A:
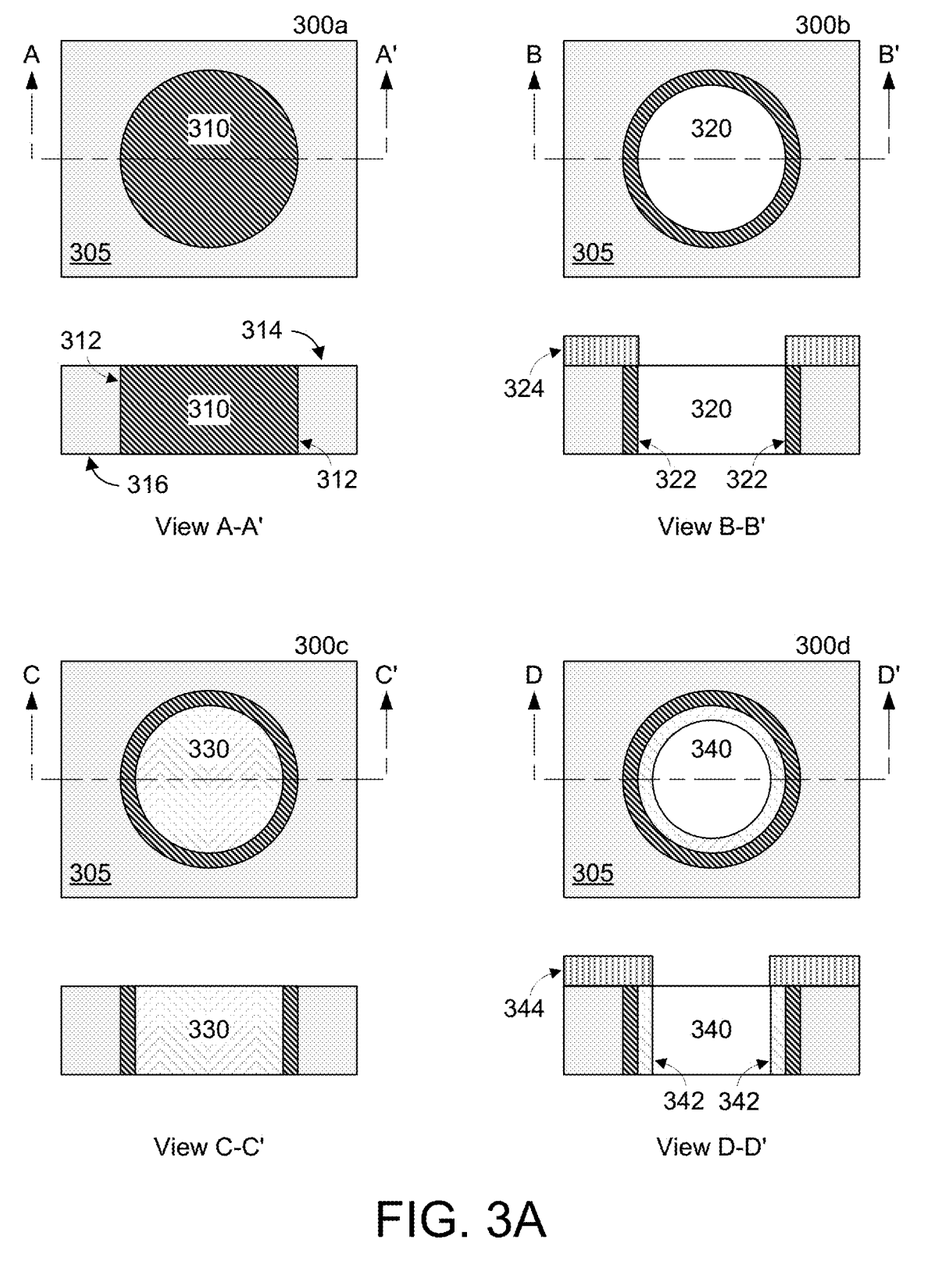
FIGS. 3A, 3B variously show top views and cross-sectional views illustrating processing to fabricate an insulation structure according to an embodiment.

In an embodiment, method 200 includes, at 210, forming in a substrate a first dielectric liner structure. The substrate may include a bulk material (e.g. silicon) of a semiconductor wafer. In another embodiment, the substrate is at least part of a printed circuit board. FIG. 3A shows top views 300*a*, 300*b*, 300*c*, 300*d*, each for a respective processing stage to variously form structures in a substrate 305. FIG. 3A further shows, for top views 300*a*, 300*b*, 300*c*, 300*d*, respective cross-sectional views A-A', B-B', C-C', D-D' of substrate 305. As illustrated by top view 300*a* and cross-sectional view A-A', a hole may be drilled, etched or otherwise formed to extend between opposing sides 314, 316 of substrate 305. It is noted that the hole may nevertheless extend only to the side of another structure (not shown), such as any metal layer or contact layer, that might adjoin one of sides 314, 316. The hole may be subsequently filled at least in part with a dielectric 310. For example, any of a variety of conventional deposition techniques may be adapted to form dielectric 310 at least along some or all of a sidewall 312 of the hole. As illustrated by top view 300*b* and cross-sectional view B-B', a first liner structure may be formed by processing—e.g., adapted from any of a variety of subtractive techniques—to remove a portion of dielectric 310. By way of illustration and not limitation, an interior portion of dielectric 310 may be removed by etching through a patterned mask 324 that is formed on side 314 of substrate 305. Such etching may result in a remaining portion of dielectric 310 forming a sidewall 322 of a first liner structure—e.g., where sidewall 322 defines at least in part a hole 320 extending through substrate 305.

Method 200 may further comprise, at 220, forming a conductive structure in the substrate, wherein the first dielectric liner structure is disposed between the conductive structure and a bulk material of the substrate. Referring again to FIG. 3A, top view 300*c* and cross-sectional view C-C' illustrate a subsequent filling of hole 320, at least in part, with a conductor 330—e.g., by electroplating and/or any of various other metal deposition techniques. As illustrated by top view 300*d* and cross-sectional view D-D', a conductive shell structure may be formed by processing to remove a portion of conductor 330. Such processing may include, for example, selectively etching an interior portion of conductor 330 through a patterned mask 344 at side 314. After the removal, a remaining portion of conductor 330 may form a sidewall 342 that, for example, defines at least in part a hole 340 extending into (e.g., through) substrate 305.

Figure 3B:
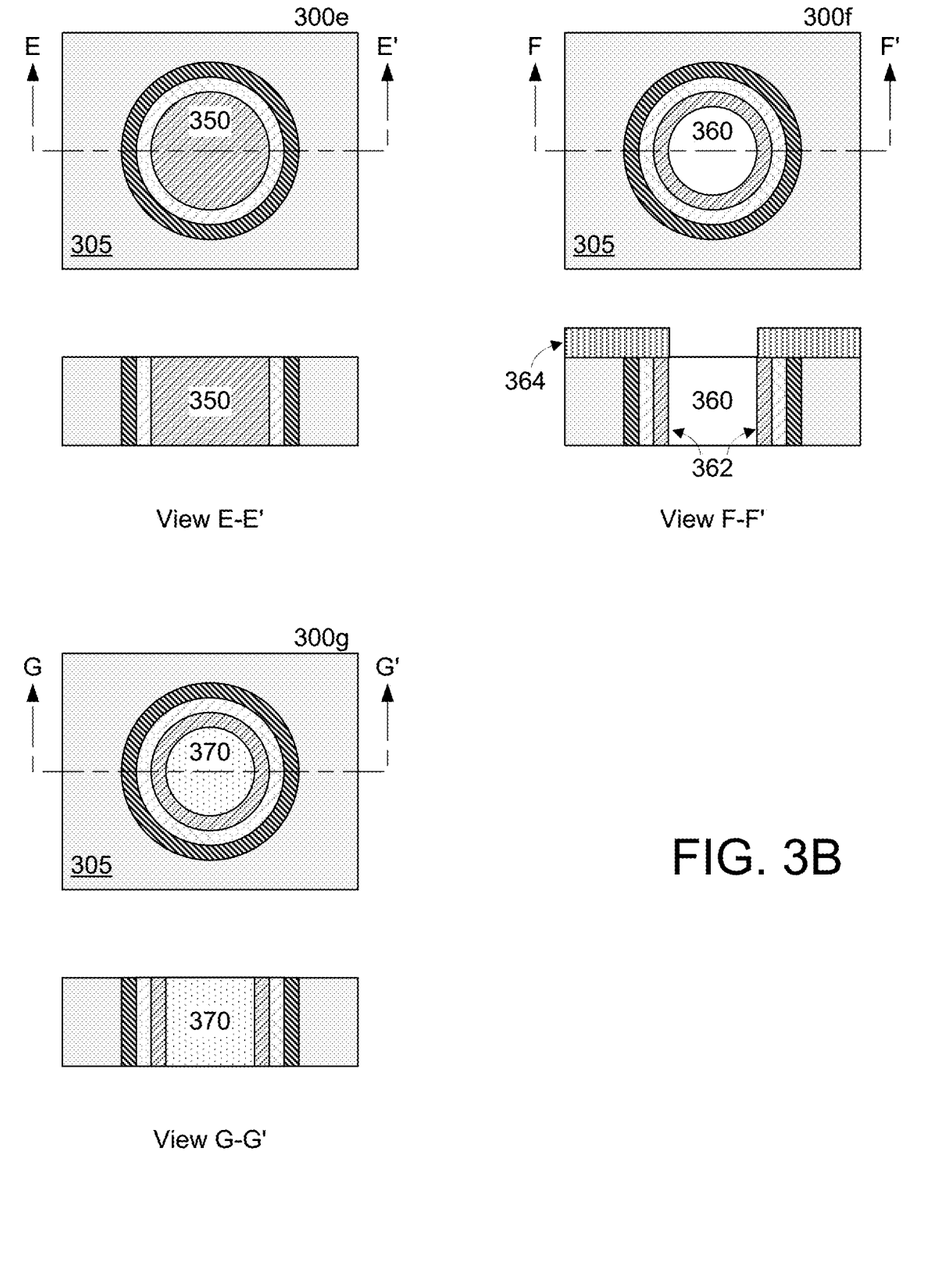

In an embodiment, method 200 further comprises, at 230, forming in the substrate a second dielectric liner structure. For example, FIG. 3B shows top views 300e, 300f, 300g, each for a respective processing stage to variously form structures in a substrate 305. FIG. 3B further shows, for top views 300e, 300f, 300g, respective cross-sectional views E-E', F-F', G-G' of substrate 305. As illustrated by top view 300e and cross-sectional view E-E', hole 340 may be subsequently filled at least in part with a dielectric 350—e.g., using processing similar to that for depositing dielectric 310. Top view 300f and cross-sectional view F-F' illustrate the formation of a second liner structure by processing to remove at least some interior portion of dielectric 350. The removal of such a portion of dielectric 350 may include, for example, selectively etching through a patterned mask 364, wherein a portion of dielectric 350 that remains after such etching forms a sidewall 362 defining, at least in part, a hole 360 extending through substrate 305. The first dielectric liner structure and the second dielectric liner structure may be formed, for example, by a contiguous body of a dielectric material. In some embodiments, the first dielectric liner structure and the second dielectric liner structure are adjoined each by another dielectric structure that, for example, both spans the conductive shell structure and isolates the conductive shell structure from some or all interconnect structures disposed in or on the substrate.

Method 200 may further comprise, at 240, forming a TI that extends from a first side of the substrate to a second side of the substrate opposite the first side, wherein the conductive structure extends at least partially around a perimeter of the TI, and wherein the second dielectric liner structure is disposed between the TI and the conductive structure. Referring again to FIG. 3B, top view 300g and cross-sectional view G-G' variously show a TI 370 formed, for example, by electroplating and/or other such additive processing to deposit a conductor in hole 360. The remaining portions of conductor 330 may form a shell structure that extends at least partially around a perimeter of TI 370—e.g., where, for some straight line extending through TI 370 (e.g., the line being secant to a cross-sectional profile of TI 370), the line passes through sidewall 342 at two points and through sidewall 322 at two points. In one embodiment, the conductive structure is decoupled from any interconnect or other circuit structure that is configured to provide a signal or a supply voltage.

Although some embodiments are not limited in this regard, method 200 may comprise one or more additional operations (not shown) that, for example, couple the TI to exchange one or more signals (e.g., including a data signal, an address signal, a control signal and/or the like) or a supply voltage or ground between the first side of the substrate and the second side of the substrate. For example, such operations may include forming on the first side a cap structure including an insulator that spans the conductive shell structure to adjoin both the first dielectric liner and the second dielectric liner. Subsequently, a contact pad or other such interconnect structure may be disposed over the cap structure, wherein the interconnect structure is electrically coupled to the TI but insulated from the shell structure.

Figure 4A:
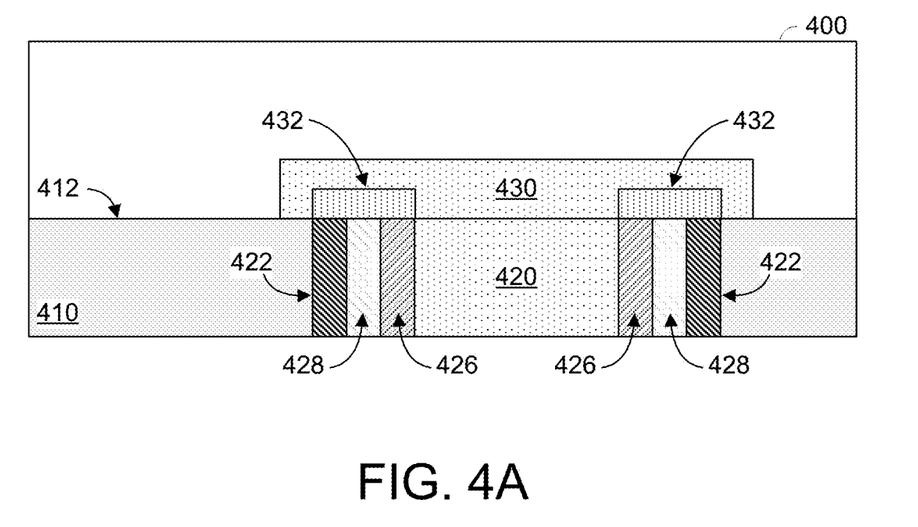
FIGS. 4A, 4B shows cross-sectional views of respective shell structures each to facilitate insulation of a through-substrate interconnect according to a corresponding embodiment.
Figure 4B:
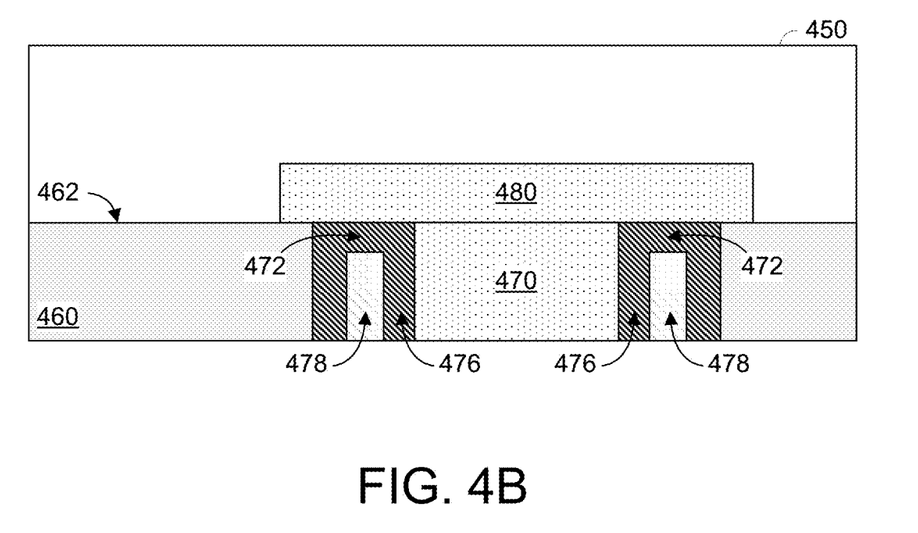

FIGS. 4A, 4B show cross-sectional views of respective devices 400, 450 each to provide electrical insulation according to a corresponding embodiment. Either of devices 400, 450 may include some of all of the features of device 100, for example. In an embodiment, fabrication of one or both of devices 400, 450 is performed according to method 200.

Device 400 is one example of an embodiment wherein dielectric liner structures on opposite sidewalls of a conductive shell structure each adjoin an encapsulating insulator that extends, on a side of a substrate, across the conductive shell structure. For example, device 400 may include a TI 420 that extends through a substrate 410. TI 420 may be coupled to exchange a signal and/or a supply voltage with circuitry (not shown) via an interconnect structure 430—such as a conductive pad, bump or the like—that is formed over TI 420 at a side 412 of substrate 410. Dielectric liners 422, 426 may be disposed in substrate 410 on opposite sidewalls of a conductive shell structure 428 that extends at least partially around a perimeter of TI 420. The arrangement of dielectric liners 422, 426 and conductive shell structure 428 may aid in insulating TI 420 from capacitive characteristics of substrate 410 (and/or of other structures formed in or on substrate 410).

For example, insulation of conductive shell structure 428 from interconnect structure 430 (and thus TI 420) may be aided by an insulator cap structure 432 disposed on side 412. The insulator cap structure 432 may comprising a dielectric—e.g., forming an annular ring—that spans across conductive shell structure 428 at side 412 to adjoin both dielectric liner structure 422 and dielectric liner structure 426. In one embodiment, the dielectric of insulator cap structure 432 is the same as a dielectric material of dielectric liner structure 422 and/or a dielectric material of dielectric liner structure 426

Device 450 is an example of another embodiment wherein a conductive shell structure does not extend all of the way to at least one side of a substrate. For example, device 450 may include a TI 470 that extends through a substrate 460. TI 470 may be coupled to exchange a signal and/or a supply voltage via an interconnect structure 480 that is formed over TI 470 at a side 462 of substrate 460. Substrate 460 may also have formed therein a conductive shell structure 478 that extends at least partially around a perimeter of TI 470. Insulation of TI 470 may be facilitated by conductive shell structure 478 and a contiguous body 476 of a dielectric material that forms respective liner structures on opposite sidewalls of conductive shell structure 478. In one embodiment, a portion 472 of body 476 extends across a side of conductive shell structure 478—e.g., where portion 472 is at least partially under side 462 and within substrate 460—to adjoin the two liner structures. Formation of portion 472 may be facilitated by depositing a conductor of shell structure 478 only to a level that is below side 462 or (alternatively) by etching, from the region that is to include portion 472, a portion of conductor material that would otherwise form part of shell structure 478.

Figure 5:
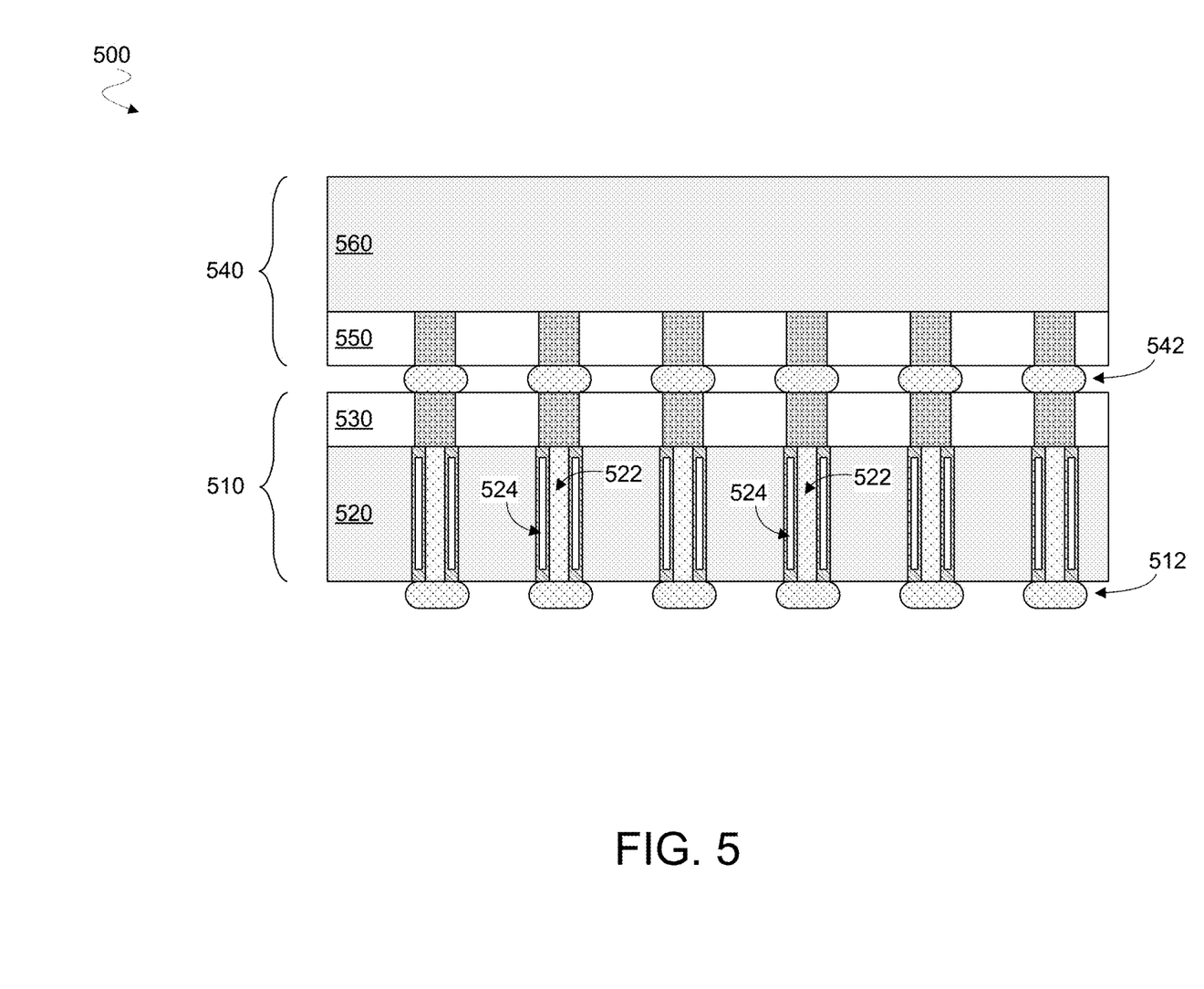
FIG. 5 is a cross-sectional view of an integrated circuit device including of insulation structures according to an embodiment.

FIG. 5 is a cross-sectional view showing some features of a system 500 to provide insulation of TI structures according to one embodiment. System 500 may include some or all of the features of one of devices 100, 400, 450 for example. In an embodiment, fabrication of some or all of system 500 is according to method 200.

System 500 includes a packaged integrated circuit (IC) chips 510, 540 coupled to one another via a hardware interface 542 (e.g., a ball grid array). In the illustrative embodiment shown, IC chip 510 includes a substrate 520, comprising bulk silicon, and a metal stack 530 including metallization structures to variously couple circuitry of IC chip 510 to respective I/O contacts of hardware interface 542. Similarly, IC chip 540 may include a silicon substrate 560 and a metal stack 550 coupling circuitry of IC chip 540 to respective I/O contacts of hardware interface 542. Another hardware interface 512 of system 500 may be disposed on a side of IC chip 510 opposite the side on which is formed hardware interface 542.

To facilitate interconnection between metal stack 530 and hardware interface 512, IC chip 510 may include one or more via structures that variously extend between opposite sides of substrate 520. By way of illustration and not limitation, TIs 522 of IC chip 510 may variously couple to both metal stack 530 and a respective conductive contact of hardware interface 512. In an embodiment, signaling via TIs 522 may each variously protected by respective insulation structures 524 formed in the semiconductor substrate of IC chip 510. Such insulation structures 524 may include, for example, a conductive shell that extends at least in part around a perimeter of a corresponding TI 522. Such a conductive shell may be isolated, by adjoining dielectric liner structures, from the corresponding TI 522 and from a semiconductor material of substrate 520.

Figure 6:
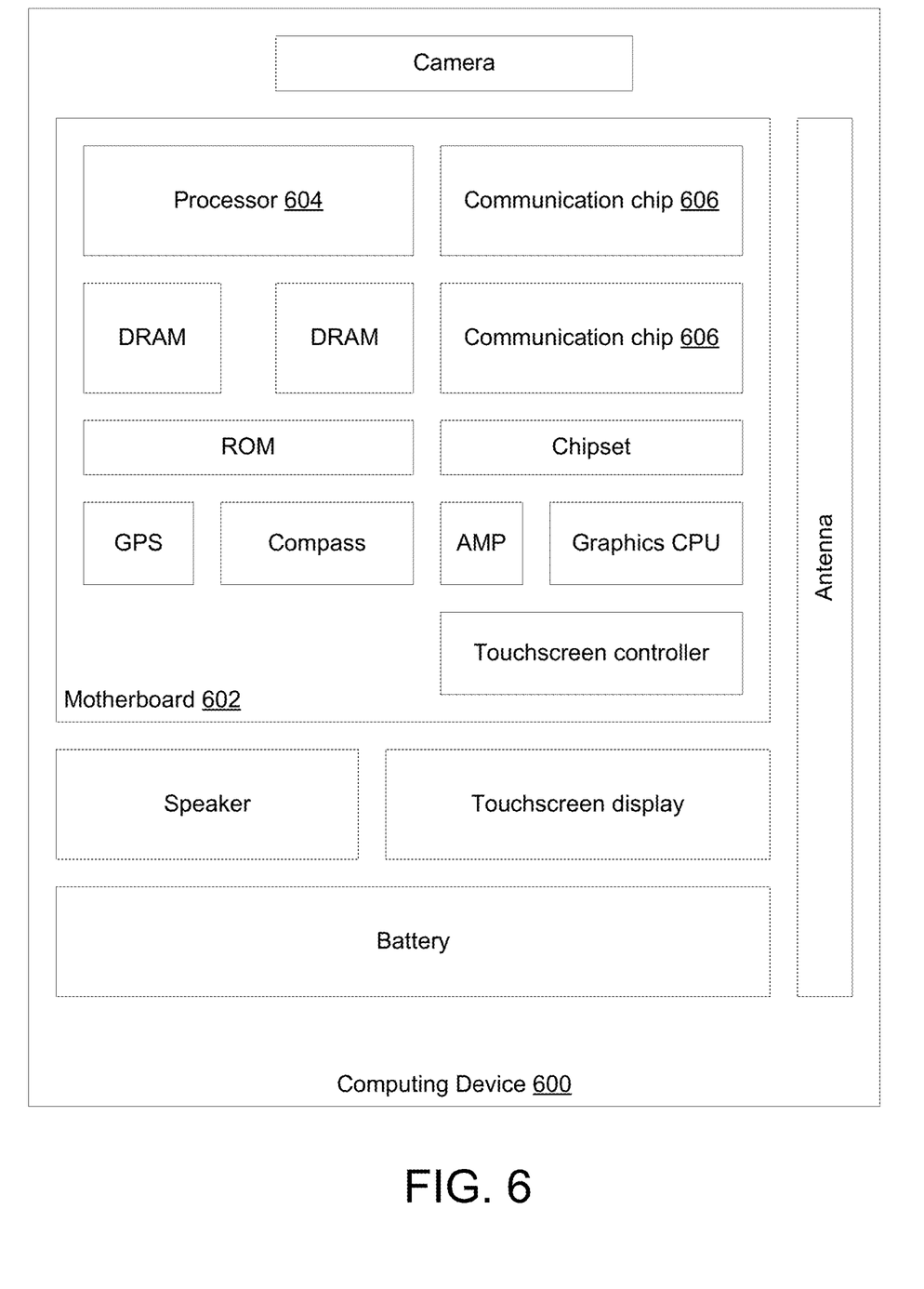
FIG. 6 is a functional block diagram illustrating an exemplary computer system, in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
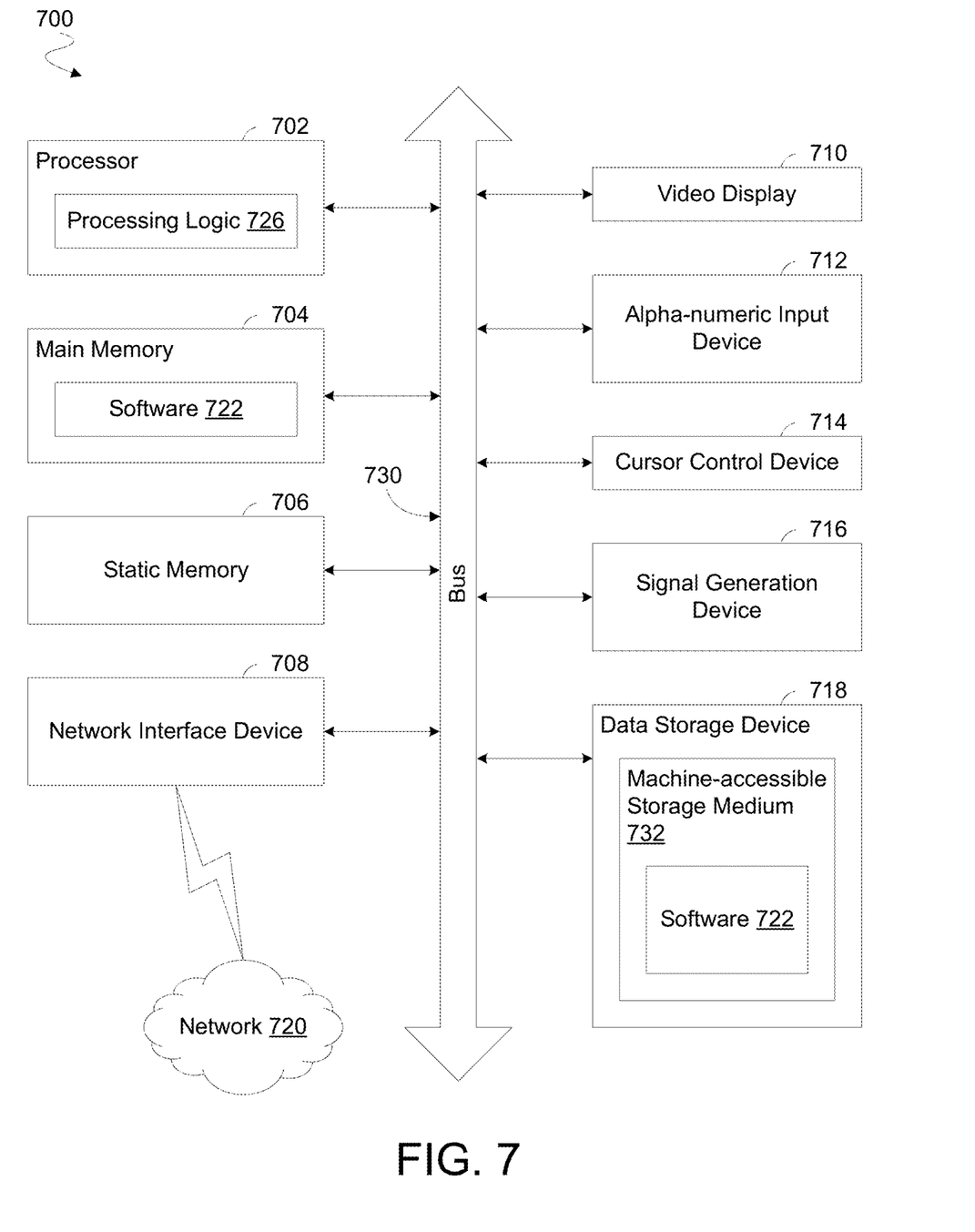
FIG. 7 is a functional block diagram illustrating an exemplary computer device, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets.

Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device comprises a substrate including a first side and a second side opposite the first side, the substrate having formed therein, a through-substrate interconnect (TI) configured to exchange a signal or a supply voltage between the first side and the second side, a conductive structure extending at least partially around a perimeter of the TI, a first dielectric liner structure disposed between the conductive structure and a bulk material of the substrate, and a second dielectric liner structure disposed between the TI and the conductive structure.

In an embodiment, the conductive structure is decoupled from any external interconnect structure. In another embodiment, the conductive structure is coupled to circuitry configured to provide a voltage, other than a reference potential, at a fixed level. In another embodiment, the device further comprises an interconnect structure disposed on the first side, the interconnect structure coupled to the TI, and an insulator cap disposed on the first side, the insulator cap disposed between the interconnect structure and the conductive structure, wherein the insulator cap adjoins the first dielectric liner and the second dielectric liner. In another embodiment, a contiguous body of a dielectric material forms the first dielectric liner structure and the second dielectric liner structure. In another embodiment, the bulk material includes silicon. In another embodiment, the substrate includes a bulk material of a printed circuit board. In another embodiment, a combined thickness of the conductive structure, the first dielectric liner and the second dielectric liner is less than a total thickness of the TI, the combined thickness measured from a sidewall of the TI. In another embodiment, the TI is coupled to exchange between the first side and the second side a data signal, a command signal, an address signal or a control signal. In another embodiment, the second dielectric liner structure adjoins the TI and the conductive structure. In another embodiment, the first dielectric liner structure adjoins the conductive structure and the bulk material. In another embodiment, the TI includes copper.

In another implementation, a method comprises forming in a substrate a first dielectric liner structure, forming a conductive structure in the substrate, wherein the first dielectric liner structure is disposed between the conductive structure and a bulk material of the substrate, forming in the substrate a second dielectric liner structure, and forming a through-substrate interconnect (TI) that extends from a first side of the substrate to a second side of the substrate opposite the first side, wherein the conductive structure extends at least partially around a perimeter of the TI, and wherein the second dielectric liner structure is disposed between the TI and the conductive structure.

In an embodiment, the conductive structure is decoupled from any external interconnect structure. In another embodiment, the method further comprises coupling the conductive structure to circuitry configured to provide a voltage, other than a reference potential, at a fixed level. In another embodiment, the method further comprises forming an insulator cap on the first side, and forming an interconnect structure on the first side, including coupling the interconnect structure to the TI, wherein the insulator cap is disposed between the interconnect structure and the conductive structure, and wherein the insulator cap adjoins the first dielectric liner and the second dielectric liner. In another embodiment, a contiguous body of a dielectric material forms the first dielectric liner structure and the second dielectric liner structure. In another embodiment, the bulk material includes silicon. In another embodiment, the substrate includes a bulk material of a printed circuit board. In another embodiment, a combined thickness of the conductive structure, the first dielectric liner and the second dielectric liner is less than a total thickness of the TI, the combined thickness measured from a sidewall of the TI. In another embodiment, the method further comprises coupling the TI to exchange a signal or a supply voltage between the first side and the second side.

In another implementation, a system comprises a printed circuit board and a packaged integrated circuit device including a substrate including a first side and a second side opposite the first side, the substrate having formed therein a through-substrate interconnect (TI) configured to exchange a signal or a supply voltage between the first side and the second side, a conductive structure extending at least partially around a perimeter of the TI, a first dielectric liner structure disposed between the conductive structure and a bulk material of the substrate, and a second dielectric liner structure disposed between the TI and the conductive structure. The system further comprises a display coupled to the printed circuit board, the display to generate an image based on an exchange between the printed circuit board and the packaged integrated circuit device.

In an embodiment, the conductive structure is decoupled from any external interconnect structure. In another embodiment, the conductive structure is coupled to circuitry configured to provide a voltage, other than a reference potential, at a fixed level. In another embodiment, the packaged integrated circuit device further comprises an interconnect structure disposed on the first side, the interconnect structure coupled to the TI, and an insulator cap disposed on the first side, the insulator cap disposed between the interconnect structure and the conductive structure, wherein the insulator cap adjoins the first dielectric liner and the second dielectric liner. In another embodiment, a contiguous body of a dielectric material forms the first dielectric liner structure and the second dielectric liner structure. In another embodiment, a combined thickness of the conductive structure, the first dielectric liner and the second dielectric liner is less than a total thickness of the TI, the combined thickness measured from a sidewall of the TI. In another embodiment, the TI is coupled to exchange between the first side and the second side a data signal, a command signal, an address signal or a control signal. In another embodiment, the second dielectric liner structure adjoins the TI and the conductive structure. In another embodiment, the first dielectric liner structure adjoins the conductive structure and the bulk material. In another embodiment, the TI includes copper.

Techniques and architectures for providing insulation of microelectronics structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
    a substrate including a first side and a second side opposite the first side, the substrate having formed therein:
        a through-substrate interconnect (TI) configured to exchange a signal or a supply voltage between the first side and the second side;
        a conductive structure extending at least partially around a perimeter of the TI;
        a contiguous body of a dielectric material comprising
            a first dielectric liner structure disposed between the conductive structure and a bulk material of the substrate,
            a second dielectric liner structure disposed between the TI and the conductive structure, and
            a third dielectric segment that is planar and parallel to the first side of the substrate, joining the first dielectric liner structure and second dielectric liner structure over the conductive structure.

2. The device of claim 1, wherein the conductive structure is decoupled from any external interconnect structure.

3. The device of claim 1, wherein the conductive structure is coupled to circuitry configured to provide a voltage, other than a reference potential, at a fixed level.

4. The device of claim 1, further comprising:
    an interconnect structure disposed on the first side, the interconnect structure coupled to the TI; and
    an insulator cap disposed on the first side, the insulator cap disposed between the interconnect structure and the conductive structure, wherein the insulator cap adjoins the first dielectric liner and the second dielectric liner.

5. The device of claim 1, wherein the bulk material includes silicon.

6. The device of claim 1, wherein the substrate includes a bulk material of a printed circuit board.

7. The device of claim 1, wherein a combined thickness of the conductive structure, the first dielectric liner and the second dielectric liner is less than a total thickness of the TI, the combined thickness measured from a sidewall of the TI.

8. A method comprising:
   forming in a substrate a first dielectric liner structure;
   forming a contiguous body of a dielectric material including
      forming a conductive structure in the substrate, wherein the first dielectric liner structure is disposed between the conductive structure and a bulk material of the substrate,
      forming in the substrate a second dielectric liner structure,
      forming a third dielectric segment that is planar and parallel to a side of the substrate, joining the first dielectric liner structure and second dielectric liner structure over the conductive structure; and
   forming a through-substrate interconnect (TI) that extends from a first side of the substrate to a second side of the substrate opposite the first side, wherein the conductive structure extends at least partially around a perimeter of the TI, and wherein the second dielectric liner structure is disposed between the TI and the conductive structure.

9. The method of claim 8, wherein the conductive structure is decoupled from any external interconnect structure.

10. The method of claim 8, further comprising coupling the conductive structure to circuitry configured to provide a voltage, other than a reference potential, at a fixed level.

11. The method of claim 8, further comprising:
   forming an insulator cap on the first side; and
   forming an interconnect structure on the first side, including coupling the interconnect structure to the TI, wherein the insulator cap is disposed between the interconnect structure and the conductive structure, and wherein the insulator cap adjoins the first dielectric liner and the second dielectric liner.

12. The method of claim 8, wherein the bulk material includes silicon.

13. The method of claim 8, wherein a combined thickness of the conductive structure, the first dielectric liner and the second dielectric liner is less than a total thickness of the TI, the combined thickness measured from a sidewall of the TI.

14. The method of claim 8, further comprising coupling the TI to exchange a signal or a supply voltage between the first side and the second side.

15. A system comprising:
   a printed circuit board;
   a packaged integrated circuit device including:
      a substrate including a first side and a second side opposite the first side, the substrate having formed therein:
         a through-substrate interconnect (TI) configured to exchange a signal or a supply voltage between the first side and the second side;
         a conductive structure extending at least partially around a perimeter of the TI;
      a contiguous body of a dielectric material comprising
         a first dielectric liner structure disposed between the conductive structure and a bulk material of the substrate,
         a second dielectric liner structure disposed between the TI and the conductive structure, and
         a third dielectric segment that is planar and parallel to the first and second sides of the substrate, joining the first dielectric liner structure and second dielectric liner structure over the conductive structure; and
   a display coupled to the printed circuit board, the display to generate an image based on an exchange between the printed circuit board and the packaged integrated circuit device.

16. The system of claim 15, wherein the conductive structure is decoupled from any external interconnect structure.

17. The system of claim 15, the packaged integrated circuit device further comprising:
   an interconnect structure disposed on the first side, the interconnect structure coupled to the TI; and
   an insulator cap disposed on the first side, the insulator cap disposed between the interconnect structure and the conductive structure, wherein the insulator cap adjoins the first dielectric liner and the second dielectric liner.

18. The system of claim 15, wherein a combined thickness of the conductive structure, the first dielectric liner and the second dielectric liner is less than a total thickness of the TI, the combined thickness measured from a sidewall of the TI.

* * * * *